United States Patent
He et al.

(10) Patent No.: US 11,432,413 B2
(45) Date of Patent: Aug. 30, 2022

(54) MULTI-LAYER VENT FOR INCREASED AIRFLOW AND EMI SHIELDING IN AN INFORMATION HANDLING SYSTEM

(71) Applicant: Dell Products L.P., Round Rock, TX (US)

(72) Inventors: Qinghong He, Austin, TX (US); Arnold Thomas Schnell, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 235 days.

(21) Appl. No.: 16/866,325

(22) Filed: May 4, 2020

(65) Prior Publication Data

US 2021/0345502 A1    Nov. 4, 2021

(51) Int. Cl.
    *H05K 5/02*    (2006.01)
    *G06F 1/18*    (2006.01)

(52) U.S. Cl.
    CPC ........... *H05K 5/0213* (2013.01); *G06F 1/182* (2013.01)

(58) Field of Classification Search
    CPC .............................. H05K 5/0213; G06F 1/182
    See application file for complete search history.

(56) References Cited

U.S. PATENT DOCUMENTS

| | | | |
|---|---|---|---|
| 5,113,315 A * | 5/1992 | Capp | H05K 1/0206 361/708 |
| 6,043,986 A * | 3/2000 | Kondo | H01L 24/32 361/720 |
| 6,646,867 B1 * | 11/2003 | Tuttle | H05K 5/0213 55/444 |
| 2002/0112653 A1 * | 8/2002 | Moore, Jr. | B65D 19/0012 108/57.25 |
| 2005/0062371 A1 * | 3/2005 | DeGabriele | H05K 5/0213 312/213 |
| 2006/0081159 A1 * | 4/2006 | Chapman | E01C 13/045 108/57.25 |
| 2008/0230305 A1 * | 9/2008 | Goto | G06F 1/182 181/224 |
| 2010/0264790 A1 * | 10/2010 | Zhan | G06F 1/181 312/236 |
| 2012/0024594 A1 * | 2/2012 | Guan | H05K 5/0213 174/547 |

(Continued)

FOREIGN PATENT DOCUMENTS

CN    109996422 A * 7/2019

*Primary Examiner* — Matthew W Ing
(74) *Attorney, Agent, or Firm* — Baker Botts, L.L.P.

(57) ABSTRACT

A vent for reduced airflow impedance and increased electromagnetic interference (EMI) shielding for an information handling system. The vent comprises two plates, wherein each plate comprises a plurality of structures. Each structure has a base opening with a first set of dimensions, a contact area with a second set of dimensions smaller than the first set of dimensions, and a wall extending at an angle from the base opening to the contact area. Each wall has a plurality of holes to increase the open percentage of the vent for decreased airflow impedance, which allows more airflow through the vent. The reduced size of each hole, the angled walls and continuous surface areas between adjacent structures reduce the amount of electromagnetic energy that can pass through the vent.

19 Claims, 3 Drawing Sheets

(56) References Cited

U.S. PATENT DOCUMENTS

| | | | |
|---|---|---|---|
| 2012/0028559 A1* | 2/2012 | Kingston | H02B 1/565 |
| | | | 454/184 |
| 2016/0044814 A1* | 2/2016 | Drew | H05K 5/0213 |
| | | | 361/752 |
| 2019/0204881 A1* | 7/2019 | Plavsic | G06F 1/206 |
| 2021/0243907 A1* | 8/2021 | Jung | H04M 1/18 |

* cited by examiner

MULTI-LAYER VENT FOR INCREASED AIRFLOW AND EMI SHIELDING IN AN INFORMATION HANDLING SYSTEM

BACKGROUND

Field of the Disclosure

This disclosure relates generally to information handling systems and, more particularly, to vents for improved airflow and electromagnetic interference (EMI) shielding of an information handling system.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include servers, gaming systems, desktop computers, and may include other information handling systems such as laptop computers and media players.

SUMMARY

Components in a chassis of an information handling system may generate heat and electromagnetic energy. A common approach for cooling information handling systems is to generate an airflow in the chassis to facilitate convective heat transfer from the components. The airflow flows through the chassis and is heated by the components, and the heated airflow exits the chassis to the ambient environment through a vent. The vent is formed to allow the heated air to flow out of the chassis and also to reduce the amount of electromagnetic energy to exit the vent. As components increase in their performance capabilities, they generate more heat and more electromagnetic energy, and as information handling systems increase in complexity, more airflow is needed to cool the components and more EMI shielding is necessary.

A vent in a chassis of an information handling system may be configured to decrease airflow impedance and increase electromagnetic interference (EMI) shielding.

In one aspect, a vent for an information handling system includes two plates, wherein each plate comprises a plurality of structures. Each structure comprises a base opening having a first set of dimensions, a contact area having a second set of dimensions smaller than the first set of dimensions, and at least one wall extending at an angle between the base opening and the contact area. Joining the contact areas of the first plate with the contact areas of the second plate forms a vent with an increased open percentage for lower airflow impedance and increased EMI shielding.

One or more of the shape of each structure, the number of walls in each structure, the angle at which a wall is formed relative to a plate, and the number and size of holes on each wall may be selected to reduce airflow impedance and increase EMI shielding. The shape of each structure may be configured to maximize EMI shielding of the vent. In some embodiments, each structure is formed with a single curved or arcuate wall, forming a conical, frustoconical shape or spherical shape. In some embodiments, each structure is formed with three or four flat walls, forming a pyramidal shape.

The angle at which a wall extends from a base opening and the number, size and shape of the holes on a wall may be selected for decreased airflow impedance and increased EMI shielding. In some embodiments, a wall may extend at an angle of between 15-75 degrees relative to a plate. In some embodiments, a wall may extend at an angle between 30-60 degrees relative to a plate.

A wall has a plurality of holes for decreased airflow impedance. The size and shape of each hole and the number of holes on a wall may be configured to maximize airflow through a plate.

The open percentage of a plate may depend on one or more of the number and shape of the plurality of structures extending from the plate, the angle of each wall relative to the plate, and the number and size of the holes on each wall.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes and contained in a chassis. For example, an information handling system may be a laptop computer, a consumer electronic device, a network storage device, or another suitable device contained in a chassis and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments may be best understood by reference to FIGS. 1-4 and 5A-5D, wherein like numbers are used to indicate like and corresponding parts.

Figure 1:
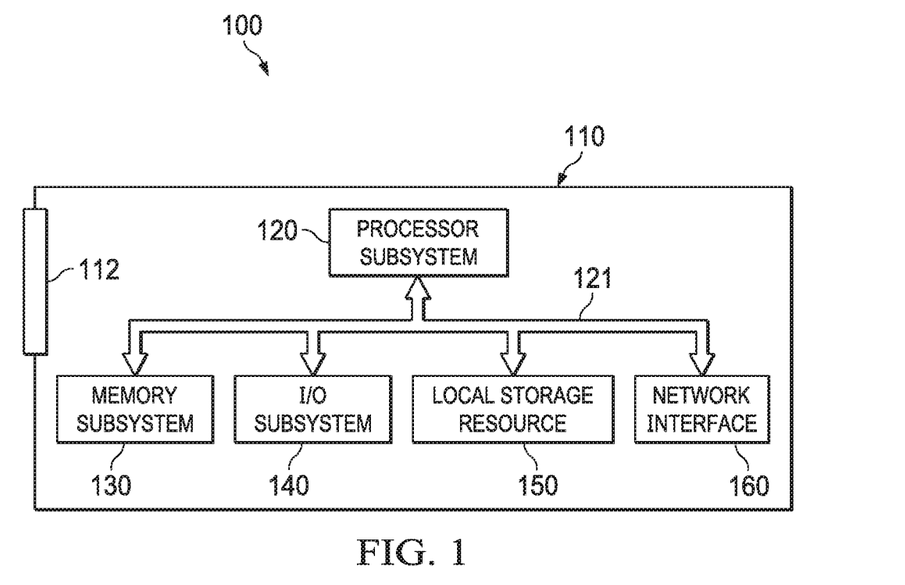
FIG. 1 is a block diagram of selected elements of an embodiment of an information handling system.

Turning now to the drawings, FIG. 1 illustrates a block diagram depicting selected elements of an embodiment of an information handling system 100 enclosed in chassis 110 with vent 112.

As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140, a local storage resource 150 and a network interface 160.

As depicted in FIG. 1, processor subsystem 120 may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, processor subsystem 120 may interpret and execute program instructions and process data stored locally (e.g., in memory subsystem 130). In the same or alternative embodiments, processor subsystem 120 may interpret and execute program instructions and process data stored remotely (e.g., in a network storage resource).

System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Also, in FIG. 1, memory subsystem 130 may comprise a system, device, or apparatus operable to retain and retrieve program instructions and data for a period of time (e.g., computer-readable media). Memory subsystem 130 may comprise random access memory (RAM), electrically erasable programmable read-only memory (EEPROM), a PCM-CIA card, flash memory, magnetic storage, opto-magnetic storage or a suitable selection or array of volatile or non-volatile memory that retains data after power is removed.

In information handling system 100, I/O subsystem 140 may comprise a system, device, or apparatus generally operable to receive and transmit data to, from or within information handling system 100. I/O subsystem 140 may represent, for example, a variety of communication interfaces, graphics interfaces, video interfaces, user input interfaces, and peripheral interfaces. I/O subsystem 140 may include more, fewer, or different input/output devices or components.

Local storage resource 150 may comprise computer-readable media (e.g., hard disk drive, floppy disk drive, CD-ROM, and other type of rotating storage media, flash memory, EEPROM, or another type of solid-state storage media) and may be generally operable to store instructions and data. For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory such as a solid-state drive (SSD) comprising solid-state flash memory.

Still referring to FIG. 1, network interface 160 may be a suitable system, apparatus, or device operable to serve as an interface between information handling system 100 and a network (not shown). Network interface 160 may enable information handling system 100 to communicate over a network using a suitable transmission protocol or standard. In some embodiments, network interface 160 may be communicatively coupled via a network to a network storage resource (not shown). A network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, Advanced Technology Attachment (ATA), Serial ATA (SATA), Advanced Technology Attachment Packet Interface (ATAPI), Serial Storage Architecture (SSA), Integrated Drive Electronics (IDE), or any combination thereof. A network coupled to network interface 160 or various components associated therewith may be implemented using hardware, software, or any combination thereof.

During operation, components of information handling system 100 may generate heat in performing any of the processes or purposes as mentioned above and may require cooling. A chassis 110 for information handling system 100 may include a fan (not shown) for generating an airflow in chassis 110 and vent 112 for allowing heated airflow to exit chassis 110.

The volume of airflow that can exit chassis 110 may depend on the size of vent 112 and the open percentage of vent 112. The size of vent 112 may be limited due to the dimensions of chassis 110. Regarding open percentage, FIG. 2 depicts a front view of an exemplary vent 200 formed from plate 202 with a plurality of openings 204 separated by continuous surface areas 206, wherein the open percentage of vent 200 formed from a single plate 202 is defined by the total area of openings 204 relative to the total area of plate 202.

The total area of openings 204 may be based on the shape, size and number of openings 204. Openings 204 may be square, rectangular, circular, or some other shape. For vent 200 depicted with square openings 204, if each opening 204 has a length ($L_{OPENING}$) of 4.5 mm and a width ($W_{OPENING}$) of 4.5 mm, each opening 204 will have an area of approximately 20.25 mm$^2$ (4.5 mm×4.5 mm). Vent 200 comprises six openings, so the total area of openings 204 will be approximately 121.5 mm$^2$ (6 openings×20.25 mm$^2$).

Continuous surface areas 206 may depend on the material used to form plate 202 and the size and shape of each opening 204. For example, for plate 202 may be formed with continuous surface areas 206 formed as ribs with each rib requiring a minimum rib thickness ($T_{RIB}$) of 1.2 mm.

Figure 2:
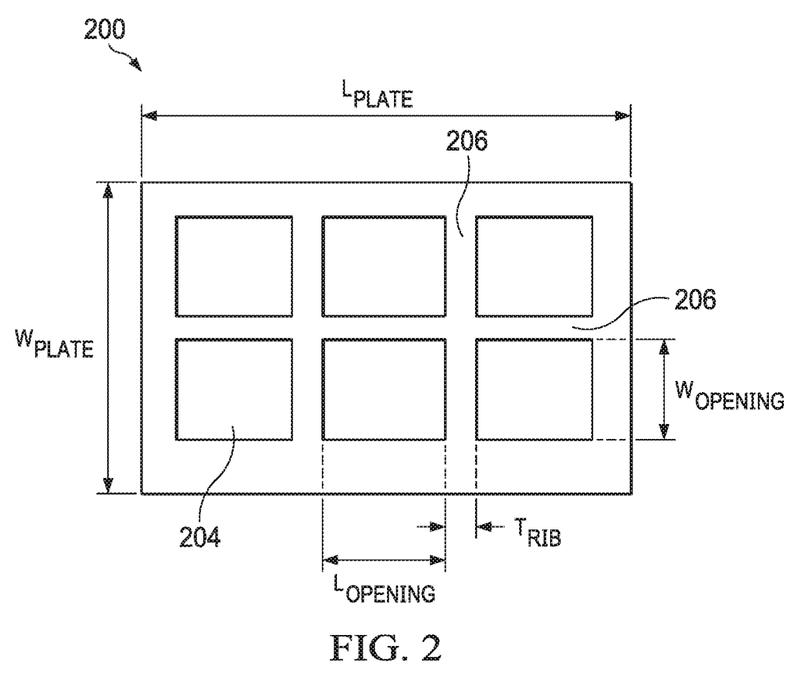
FIG. 2 is a front view of vent for an information handling system with a plurality of openings separated by a plurality of ribs.

Regarding the total area of vent 200, as depicted in FIG. 2, plate 202 may be rectangular and defined by a plate length ($L_{PLATE}$) and a plate width ($W_{PLATE}$). The plate length ($L_{PLATE}$) depends on the number of openings 204, the length ($L_{OPENING}$) of each opening 204, and the thickness ($T_{RIB}$) of each continuous surface area 206 between adjacent openings 204 and at the top and bottom edges. Plate 202 configured with three openings 204 along its length with each opening 204 having a length ($L_{OPENING}$) of 4.5 mm, and four continuous surface areas 206 with each continuous surface 206 having a thickness ($T_{RIB}$) of 1.2 mm may have a plate length ($L_{PLATE}$) of approximately 18.3 mm.

The plate width ($W_{PLATE}$) depends on the number of openings 204, the width ($W_{OPENING}$) of each opening 204, and the thickness ($T_{RIB}$) of each continuous surface area 206 between adjacent openings 204 and at the side edges. Plate 202 configured with two openings 204 along its width with each opening 204 having a length ($L_{OPENING}$) of 4.5 mm, and three continuous surface areas 206 with each continuous surface 206 having a thickness ($T_{RIB}$) of 1.2 mm may have a plate width ($W_{PLATE}$) of approximately 12.6 mm.

For plate 202 having a plate length ($L_{PLATE}$) of approximately 18.3 mm and a plate width ($W_{PLATE}$) of approximately 12.6 mm, a total area of plate 202 may be calculated as approximately 230.6 mm$^2$.

Using the dimensions mentioned above, the open percentage of plate 202 (and therefore vent 200) depicted in FIG. 2 may be calculated as approximately 62% (121.5 mm$^2$/230.6 mm$^2$).

As information handling systems 100 include more components and components generate more heat, more airflow must exit chassis 110. Increasing the size of each opening 204 increases the open percentage of plate 202, which reduces the airflow impedance to allow more airflow through vent 200. However, vent 200 must also provide more EMI shielding and increasing the size of openings 204 would increase the amount of electromagnetic interference (EMI). In particular, as the size of openings 204 in vent 200 increases, more electromagnetic energy may pass through openings 204 and plate 202.

Vents disclosed herein provide a technical solution for increasing the open percentage to decrease airflow impedance and increasing EMI shielding capability.

Figure 3:
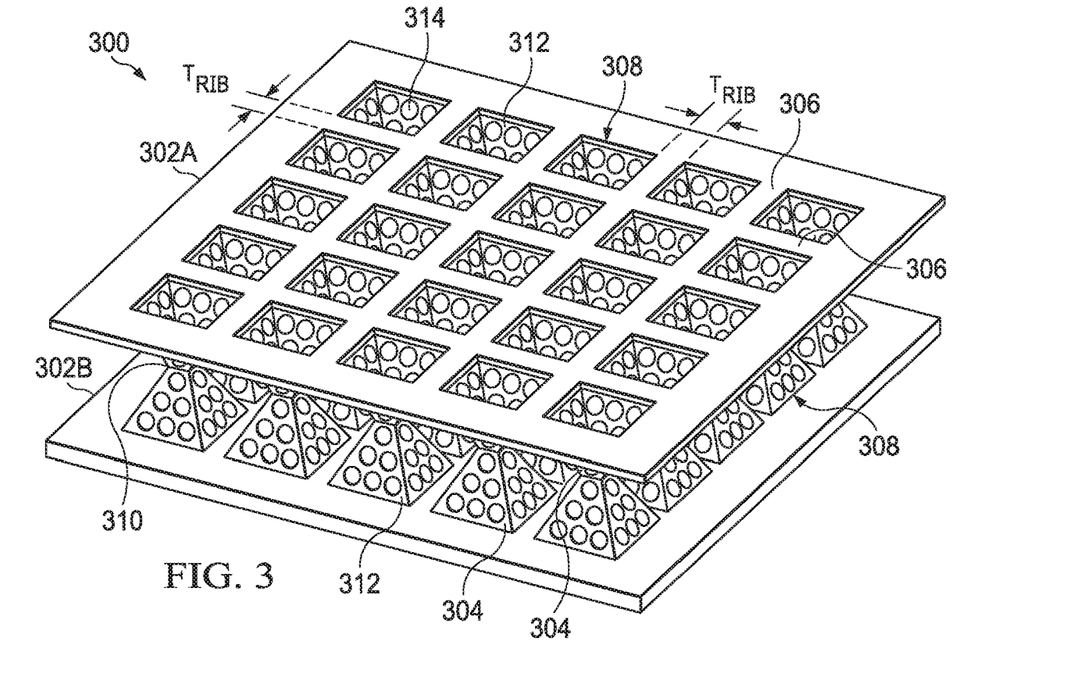
FIG. 3 is a perspective view of one embodiment of a multi-layered vent for an information handling system.
Figure 4:
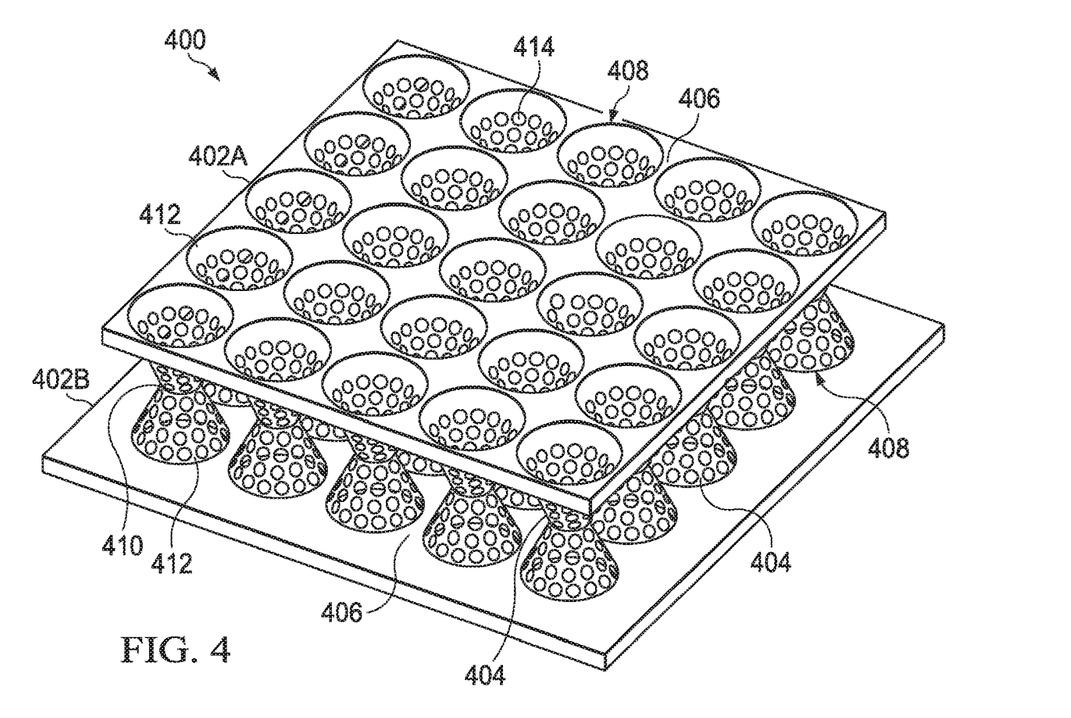
FIG. 4 is a perspective view of one embodiment of a multi-layered vent for an information handling system.

Referring to FIGS. 3 and 4, embodiments of a multi-layered vent may be configured with multiple plates. Each plate may be configured to with an open percentage to decrease airflow impedance through the vent, and two or more plates may be joined to form a vent with increased EMI shielding.

Referring to FIG. 3, vent 300 may comprise first plate 302A configured with a first plurality of structures 304 and second plate 302B configured with a second plurality of structures 304. Each structure 304 may be separated from adjacent structures 304 by continuous surface areas 306. Each structure 304 comprises base opening 308, contact area 310 and at least one wall 312 extending at an angle from base opening 308 to contact area 310. Base opening 308 may have a first set of dimensions (e.g., length, width) and contact area 310 may have a second set of dimensions (e.g., length, width) such that the surface area of contact area 310 is smaller than base opening 308 and each wall 312 extends at a non-orthogonal angle relative to first plate 302A or 302B.

As depicted in FIG. 3, base opening 308 may be square with a length and a width and structure 304 may be pyramidal with four walls 312 extending between base opening 308 and contact area 310. Each wall 312 comprises a plurality of holes 314 to allow airflow through plates 302A, 302B of vent 300. Each continuous surface area 306 may have a thickness ($T_{RIB}$).

Referring to FIG. 4, vent 400 may comprise first plate 402A configured with a first plurality of structures 404 and second plate 402B configured with a second plurality of structures 404. Each structure 404 may be separated from adjacent structures 404 by continuous surface areas 406. Each structure 404 comprises base opening 408, contact area 410 and at least one wall 412 extending at an angle from base opening 408 to contact area 410. Base opening 408 may have a first set of dimensions (e.g. a diameter) and contact area 410 may have a second set of dimensions (e.g., a diameter) such that contact area 410 is smaller than base opening 408 and each wall 412 extends at a non-orthogonal angle relative to first plate 402A or 402B.

As depicted in FIG. 4, base opening 408 may be circular and structures 404 may be frustoconical with a single wall 412 extending between base opening 408 and contact area 410. Wall 412 comprises a plurality of holes 414 to allow airflow through plates 402A, 402B of vent 400. Each continuous surface area 406 may have a minimum thickness ($T_{RIB}$) between adjacent structures 404.

FIGS. 5A-5D depict side views illustrating steps in one embodiment of a method for manufacturing a vent for improved cooling and EMI shielding of components in chassis 110 of information handling system 100.

Figure 5A:
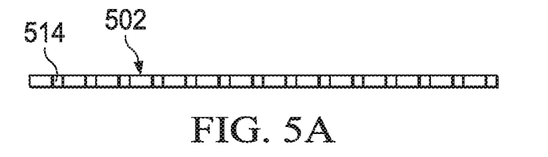
FIG. 5A depicts a side view of a first plate of a multi-layered vent.

A method for manufacturing vent 500 may start with plate 502. Plate 502 may initially be formed as a continuous surface. In some embodiments, as depicted in FIG. 5A, plate 502 may be formed with a plurality of holes 514 formed therein.

Figure 5B:
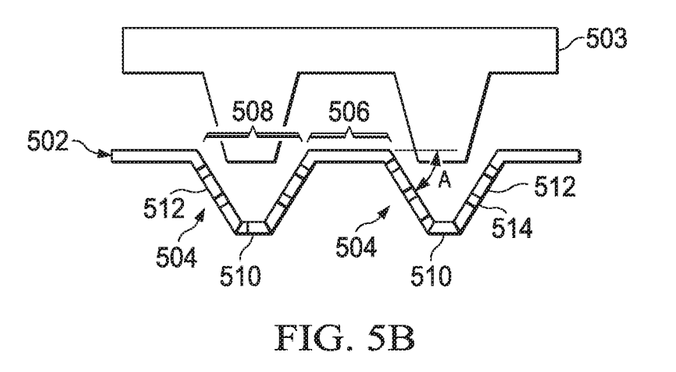
FIG. 5B depicts a side view of a plate of a multi-layered vent, illustrating a method for forming a plurality of structures on the plate.

As depicted in FIG. 5B, plate 502 may be stamped with stamp 503 or machined to have a plurality of structures 504 formed therein. The shape of stamp 503 may be configured to form a desired shape of structures 504. Stamp 503 depicted in FIG. 5B is representative for describing a process for forming structures 504 and is not drawn to scale. For example, the angle (A) may be formed at any angle between 15-75 degrees, contact areas 510 and base openings 508 may be larger or smaller, and the position of holes 514 on walls 512 may vary. Thus, stamp 503 may have a shape to form structures 504 similar to structures 304 depicted in FIG. 3 or structures 404 depicted in FIG. 4. Each structure 504 may be separated from adjacent structures 504 by continuous surface areas 506. Each structure 504 may be formed with base opening 508, contact area 510 and at least one wall 512 extending from base opening 508 to contact area 510 at an angle (A). Base opening 508 may have a first set of dimensions and contact area 510 may have a second set of dimensions such that contact area 510 is smaller than base opening 508 and each wall 512 extends at a non-orthogonal angle relative to plate 502. In some embodiments, each wall 512 extends at an angle (A) of between 15-75 degrees relative to plates 502A, 502B to form structure 504. In some embodiments, each wall 512 extends at an angle (A) between 30-60 degrees relative to plate 502 to form structure 504.

Figure 5C:
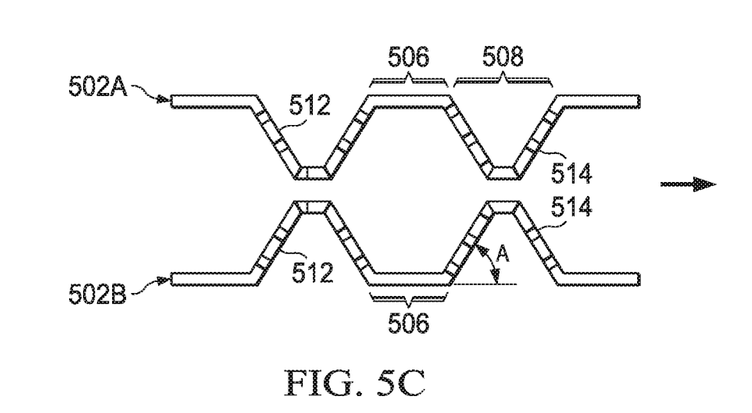
FIG. 5C depicts a side view of first and second plates such as depicted in FIG. 5B, illustrating contact areas of a first plate positioned relative to contact areas of a second plate.
Figure 5D:
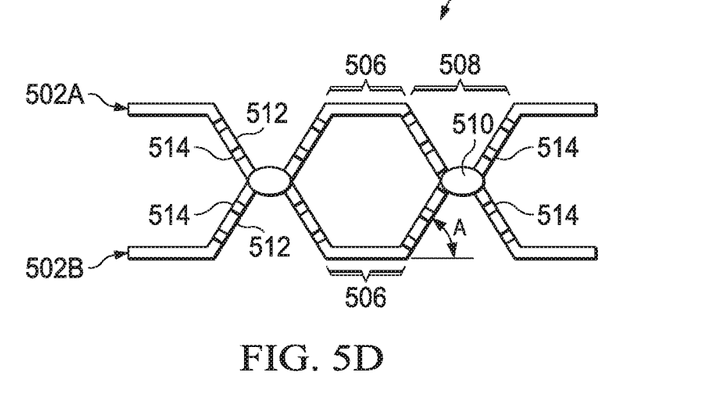
FIG. 5D depicts a side view of one embodiment of a vent formed by first and second plates with joined contact areas.

Two or more plates 502 may be joined to form vent 500 depicted in FIG. 5D. As depicted in FIGS. 5C and 5D, first plate 502A and second plate 502B may be positioned relative to each other and coupled to form vent 500 with increased open percentage for reduced airflow impedance and with increased EMI shielding.

As depicted in FIG. 5C, first plate 502A may be positioned relative to second plate 502B to align contact areas 510.

As depicted in FIG. 5D, contact areas 510 on first plate 502A and second plate 502B may be welded to form continuous surfaces for increased EMI shielding.

The process depicted in FIGS. 5A-5D may be used to form multiple-layered vents with various structures, including vents 300 and 400 having an increased open percentage and increased EMI shielding as compared to single layer vents such as vent 200 depicted in FIG. 2.

For ease of understanding how a multi-layered vent may decrease airflow impedance and increase EMI shielding, vent 300 comprising two plates 302 may be compared with vent 200. In this comparison, base openings 308 in plates 302A, 302B and openings 204 are square with a length of 4.5 mm and a width of 4.5 mm.

Reduced Airflow Impedance

Referring to FIG. 2, vent 200 comprises a single plate 202 with a plurality of openings 204, with each opening 204 being square with a length ($L_{OPENING}$) and a width ($W_{OPENING}$). For vent 200 having a length ($L_{PLATE}$) and a width ($W_{PLATE}$), the open percentage and EMI shielding of plate 202 (and therefore vent 200) corresponds to the shape, size and number of openings 204.

Referring to FIG. 3, vent 300 comprises multiple plates 302A, 302B with a plurality of pyramidal structures 304, wherein each structure 304 comprises base opening 306. If each plate 302A, 302B in vent 300 has the same number of structures 304 as the number of openings 204 in plate 202 and each base opening 308 in plates 302A, 302B has the same dimensions as each opening 204 in plate 202, then a difference in open percentage may depend on one or more of the number, shape and size of holes 314. Since each structure 304 depicted in FIG. 3 comprises multiple walls 312 and each wall 312 comprises a plurality of holes 314, increasing one or more of the number of holes 314 or the size of each hole may increase the open percentage of plates 302A and 302B. In some embodiments, vent 300 may be formed with an open percentage greater than 80%, whereas the open percentage of vent 200 may be approximately 62% as discussed above. Vent 400 may also be formed with an open percentage greater than 80%.

EMI Shielding

As described above, EMI shielding by vent 200 may depend on the size and number of openings 204 in plate 202.

Regarding EMI shielding by vent 300, the amount of electromagnetic interference (EMI) associated with vent 300 may depend on the amount of electromagnetic energy that can pass through both plates 302A and 302B. Accordingly, vent 300 may be configured with smaller holes 314 and walls 312 formed at an angle (A) to provide the smallest number of direct routes between plates 302A and 302B.

For more detail, FIG. 5D depicts a side view of vent 500. Contact areas 510 of plates 502A, 502B may be welded to form continuous surfaces, and continuous surface areas 506 and welded contact areas 510 prevent direct passage of electromagnetic energy. Thus, for electromagnetic energy to pass through vent 500, the electromagnetic energy must pass through a first hole 514 in a first wall 512 configured at a first angle (A) and pass through a second hole 514 on a second wall 512 configured at a second angle (A).

Walls 512 extending at an angle (A) relative to plates 502A, 502B may deflect electromagnetic energy in directions away from holes 514, decreasing the amount of electromagnetic energy that passes through both plates 502A and 502B of vent 500. Holes 514 formed on walls 512 extending at an angle (A) provide a smaller direct passage for electromagnetic energy, decreasing the amount of electromagnetic energy that passes through both plates 502A and 502B of vent 500. In some embodiments, the angle (A) is a non-orthogonal angle. In some embodiments, the angle (A) is between 15 and 75 degrees. In some embodiments, the angle (A) is between 30 and 60 degrees. In some embodiments, the angle (A) for a first plate 502A is equal to the angle (A) of the second plate 502B.

Referring to FIG. 3, structures 304 may be configured with angular walls 310 oriented such that electromagnetic energy passes through holes 312 only in certain directions, reducing the likelihood that electromagnetic energy can pass through holes 314 in both plates 302A and 302B. Referring to FIG. 4, structures 404 may be configured with curved or arcuate walls 410 such that only a small percentage of electromagnetic energy passes through openings 414 in any given direction, reducing the likelihood that electromagnetic energy can pass through holes 412 in both plates 402A and 402B.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A vent in a chassis of an information handling system, the vent comprising:
   a plurality of plates comprising at least a first plate and a second plate, wherein:
      the first plate of the plurality of plates comprises a first plurality of structures and the second plate comprises a second plurality of structures, wherein each structure of the first plurality of structures is separated from an adjacent structure of the first plurality of structures by a continuous surface area and each structure of the second plurality of structures is separated from an adjacent structure of the second plurality of structures by a continuous surface area;

each structure of the first plurality of structures and the second plurality of structures comprises:
　a base opening defining a first set of dimensions;
　a contact area defining a second set of dimensions smaller than the first set of dimensions; and
　at least one wall extending from the base opening to the contact area, the at least one wall comprising a plurality of holes; and
the first plurality of structures on the first plate are coupled to the second plurality of structures on the second plate at their respective contact areas.

2. The vent of claim 1, wherein:
the first plurality of structures and the second plurality of structures comprise pyramidal structures;
each base opening comprises an angular opening;
the first set of dimensions comprises a base opening length and a base opening width;
each contact area defines an angular contact area;
the second set of dimensions comprises a length and a width;
the length of the contact area is less than the base opening length;
the width of the contact area is less than the width of the base opening; and
each structure of the first plurality of structures and the second plurality of structures comprises a plurality of walls extending from the base opening to the contact area.

3. The vent of claim 1, wherein:
the first plurality of structures and the second plurality of structures comprise conical structures;
each base opening comprises a circular opening;
the first set of dimensions comprises a base opening diameter;
each contact area defines a circular area;
the second set of dimensions comprises a contact area diameter;
the contact area diameter is less than the base opening diameter; and
each structure of the first plurality of structures and the second plurality of structures comprises a single wall extending from the base opening to the contact area.

4. The vent of claim 1, wherein each wall extends at a non-orthogonal angle from a base opening to the contact area.

5. The vent of claim 4, wherein each wall extends at an angle between 15-75 degrees relative to a plate of the plurality of plates.

6. The vent of claim 4, wherein each wall extends at an angle between 30-60 degrees relative to the plate of the plurality of plates.

7. The vent of claim 1, wherein each of the first plate and the second plate have an open percentage greater than 70%.

8. The vent of claim 1, wherein the first plate and the second plate are parallel.

9. A vent in a chassis of an information handling system, the vent comprising:
　a first plate comprising a first plurality of structures separated by a first plurality of continuous surface areas; and
　a second plate comprising a second plurality of structures separated by a second plurality of continuous surface areas, wherein:
　　each structure of the first plurality of structures and each structure of the second plurality of structures comprises:
　　　a base opening defining a first set of dimensions;
　　　a contact area with a continuous surface defining a second set of dimensions, wherein the contact area is smaller than the base opening; and
　　　at least one wall extending from the base opening to the contact area, the at least one wall comprising a plurality of holes; and
　the plurality of structures on the first plate are coupled to the plurality of structures on the second plate at their respective contact areas to form a continuous surface.

10. The vent of claim 9, wherein:
the first plurality of structures and the second plurality of structures comprise pyramidal structures;
each base opening comprises an angular opening defining a first set of dimensions comprising a base opening length and a base opening width;
each contact area comprises an angular area defining a second set of dimensions comprising a contact area length and a contact area width, wherein the contact area length is less than the base opening length and the contact area width is less than the base opening width;
each structure comprises a plurality of walls extending at a non-orthogonal angle from the base opening to the contact area; and
each wall comprises a plurality of holes.

11. The vent of claim 9, wherein:
the first plurality of structures and the second plurality of structures comprise conical structures;
each base opening comprises a circular opening defining a base opening diameter;
each contact area comprises a circular area defining a contact area diameter, wherein the contact area diameter is less than the base opening diameter;
each structure comprises a single wall extending from the base opening to the contact area; and
the wall comprises a plurality of holes.

12. The vent of claim 9, wherein each wall on each structure of the plurality of structures on the first plate extends at an angle between 15-75 degrees relative to the first plate.

13. The vent of claim 9, wherein the first plate and the second plate are parallel.

14. A chassis for an information handling system, the chassis comprising:
　a panel with a vent comprising:
　　a first plate comprising a first plurality of structures separated by a first plurality of continuous surface areas; and
　　a second plate comprising a second plurality of structures separated by a second plurality of continuous surface areas, wherein:
　　　each structure of the first plurality of structures and each structure of the second plurality of structures comprises:
　　　　a base opening comprising a first set of dimensions;
　　　　a contact area with a continuous surface defining a second set of dimensions, wherein the contact area is smaller than the base opening; and at least one wall extending from the base opening to the contact area, the at least one wall comprising a plurality of holes; and the plurality of structures on the first plate are coupled to the plurality of structures on the second plate at their respective contact areas to form continuous surfaces.

15. The chassis of claim 14, wherein:

the first plurality of structures and the second plurality of structures comprise pyramidal structures;

each base opening comprises an angular opening defining a first set of dimensions comprising a base opening length and a base opening width;

each contact area comprises an angular area defining a second set of dimensions comprising a contact area length and a contact area width, wherein the contact area length is less than the base opening length and the contact area width is less than the base opening width;

each structure comprises a plurality of walls extending at a non-orthogonal angle from the base opening to the contact area; and each wall comprises a plurality of holes.

16. The chassis of claim 14, wherein:

the first plurality of structures and the second plurality of structures comprise conical structures;

each base opening comprises a circular opening defining a base opening diameter;

each contact area comprises a circular area defining a contact area diameter, wherein the contact area diameter is less than the base opening diameter;

each structure comprises a single wall extending from the base opening to the contact area; and the wall comprises a plurality of holes.

17. The chassis of claim 14, wherein each wall on each structure of the plurality of structures on the first plate extends at an angle between 15-75 degrees relative to the first plate.

18. The chassis of claim 14, wherein each of the first plate and the second plate have an open percentage greater than 70%.

19. The chassis of claim 14, wherein the first plate and the second plate are parallel.

* * * * *